United States Patent
Kim

(10) Patent No.: US 11,164,762 B2
(45) Date of Patent: Nov. 2, 2021

(54) ULTRAVIOLET IRRADIATION APPARATUS AND METHOD OF MANUFACTURING A SEMICONDUCTOR PACKAGE USING THE SAME

(71) Applicant: SAMSUNG ELECTRONICS CO., LTD., Suwon-si (KR)

(72) Inventor: Hojae Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/839,139

(22) Filed: Apr. 3, 2020

(65) Prior Publication Data

US 2021/0074562 A1    Mar. 11, 2021

(30) Foreign Application Priority Data

Sep. 5, 2019 (KR) .................. 10-2019-0110044

(51) Int. Cl.
*H01L 21/67* (2006.01)
*H01L 21/683* (2006.01)

(52) U.S. Cl.
CPC .... *H01L 21/67115* (2013.01); *H01L 21/6836* (2013.01); *H01L 2221/68327* (2013.01); *H01L 2221/68381* (2013.01)

(58) Field of Classification Search
CPC ........... H01L 21/67115; H01L 21/6836; H01L 2221/68327; H01L 2221/68381
USPC ....................................................... 438/462
See application file for complete search history.

(56) References Cited

U.S. PATENT DOCUMENTS

| | | | |
|---|---|---|---|
| 6,297,131 B1 | 10/2001 | Yamada et al. | |
| 6,399,922 B2* | 6/2002 | Okase | C23C 14/083 118/724 |
| 7,394,076 B2 | 7/2008 | Devitt | |
| 7,517,724 B2* | 4/2009 | Hatakeyama | H01L 24/27 438/114 |
| 8,584,612 B2* | 11/2013 | Hart | H01L 21/67115 118/50.1 |
| 9,601,375 B2* | 3/2017 | Lei | H01L 21/268 |
| 9,895,871 B2 | 2/2018 | Shih et al. | |
| 2019/0072989 A1 | 3/2019 | Nagai et al. | |

FOREIGN PATENT DOCUMENTS

| | | |
|---|---|---|
| JP | 3865184 | 1/2007 |
| JP | 20080511138 | 4/2008 |
| JP | 6188051 | 8/2017 |
| JP | 20180006380 | 1/2018 |
| JP | 6399124 | 10/2018 |
| KR | 10-2014-0027453 | 3/2014 |
| KR | 1749625 | 6/2017 |

* cited by examiner

*Primary Examiner* — Vu A Vu
(74) *Attorney, Agent, or Firm* — F. Chau & Associates, LLC

(57) ABSTRACT

An ultraviolet (UV) irradiation apparatus includes: a base module configured to support a wafer including a plurality of semiconductor chips, wherein the plurality of semiconductor chips are connected with each other via a die attach film (DAF); a vacuum module configured to provide the wafer with a vacuum and to remove air from the DAF; a UV irradiation module configured to irradiate UV to the wafer in the vacuum module; and an expanding module configured to expand the wafer in the vacuum module.

19 Claims, 15 Drawing Sheets

US 11,164,762 B2

ULTRAVIOLET IRRADIATION APPARATUS AND METHOD OF MANUFACTURING A SEMICONDUCTOR PACKAGE USING THE SAME

CROSS-REFERENCE TO RELATED APPLICATION

This application claims priority under 35 U.S.C. § 119 to Korean Patent Application No. 10-2019-0110044, filed on Sep. 5, 2019 in the Korean Intellectual Property Office (KIPO), the disclosure of which is incorporated by reference herein in its entirety.

TECHNICAL FIELD

Exemplary embodiments of the present inventive concept relate to an ultraviolet (UV) irradiation apparatus and a method of manufacturing a semiconductor package using the same. More particularly, exemplary embodiments of the present inventive concept relate to a UV irradiation apparatus configured to cure a die attach film (DAF) attached to a wafer to be sawed, and a method of manufacturing a semiconductor package using the UV irradiation apparatus.

DISCUSSION OF THE RELATED ART

Generally, a semiconductor package may be manufactured by a process for attaching a die attach film (DAF) to a wafer, a process for cutting scribe lanes of the wafer to singulate the wafer into a plurality of semiconductor chips, a process for irradiating the DAF with UV rays to cure the DAF, a process for picking-up the semiconductor chips from the DAF, a process for mounting the semiconductor chips on a package substrate, etc. Typically, a DAF may include a base film, a photo sensitive adhesive (PSA) and an adhesive layer sequentially stacked. The process for curing the DAF may reduce bondability of the PSA.

In general, a space may be generated between the adhesive layer attached to the semiconductor chip and the PSA due to a warpage of the semiconductor chip. For example, air may infiltrate into the space between the adhesive layer and the PSA. Oxygen in the air may hinder a bridging reaction on an exposed surface of the PSA so that the bondability of the PSA may not be reduced. Thus, the semiconductor chip may not be picked-up from the DAF since the PSA may still be bonded to the DAF.

SUMMARY

According to an exemplary embodiment of the present inventive concept, an ultraviolet (UV) irradiation apparatus includes: a base module configured to support a wafer including a plurality of semiconductor chips, wherein the plurality of semiconductor chips are connected with each other via a die attach film (DAF); a vacuum module configured to provide the wafer with a vacuum and to remove air from the DAF; a UV irradiation module configured to irradiate UV to the wafer in the vacuum module; and in expanding module configured to expand the wafer in the vacuum module.

According to an exemplary embodiment of the present inventive concept, an ultraviolet (UV) irradiation apparatus includes a UV irradiation module configured to irradiate UV to a wafer to cure the DAF, wherein the wafer includes a plurality of semiconductor chips connected with each other via a die attach film (DAF); a base having a window configured to pass the UV irradiated from the UV irradiation module therethrough; a wafer holder installed at the window and configured to hold the wafer; an expanding press arranged over the base and configured to move in a vertical direction to expand the wafer and combine with the wafer holder to form a vacuum chamber configured to receive the wafer, a vacuum pump configured to provide the vacuum chamber with vacuum; a loading module configured to load a cassette into a loading position, wherein the cassette is configured to receive the wafers; and a transfer module configured to transfer the received wafer in the cassette to the wafer holder.

According to an exemplary embodiment of the present inventive concept, a method of manufacturing a semiconductor package includes: attaching a die attach film (DAF) to a wafer; cutting a scribe lane of the wafer to singulate the wafer into a plurality of semiconductor chips; providing the wafer with vacuum to remove air from the DAF; irradiating an ultraviolet (UV) to the wafer to cure the DAF; picking-up the semiconductor chips from the DAF; and mounting the semiconductor chips on a package substrate.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be explained in detail with reference to the accompanying drawings.

UV Irradiation Apparatus

Figure 1:
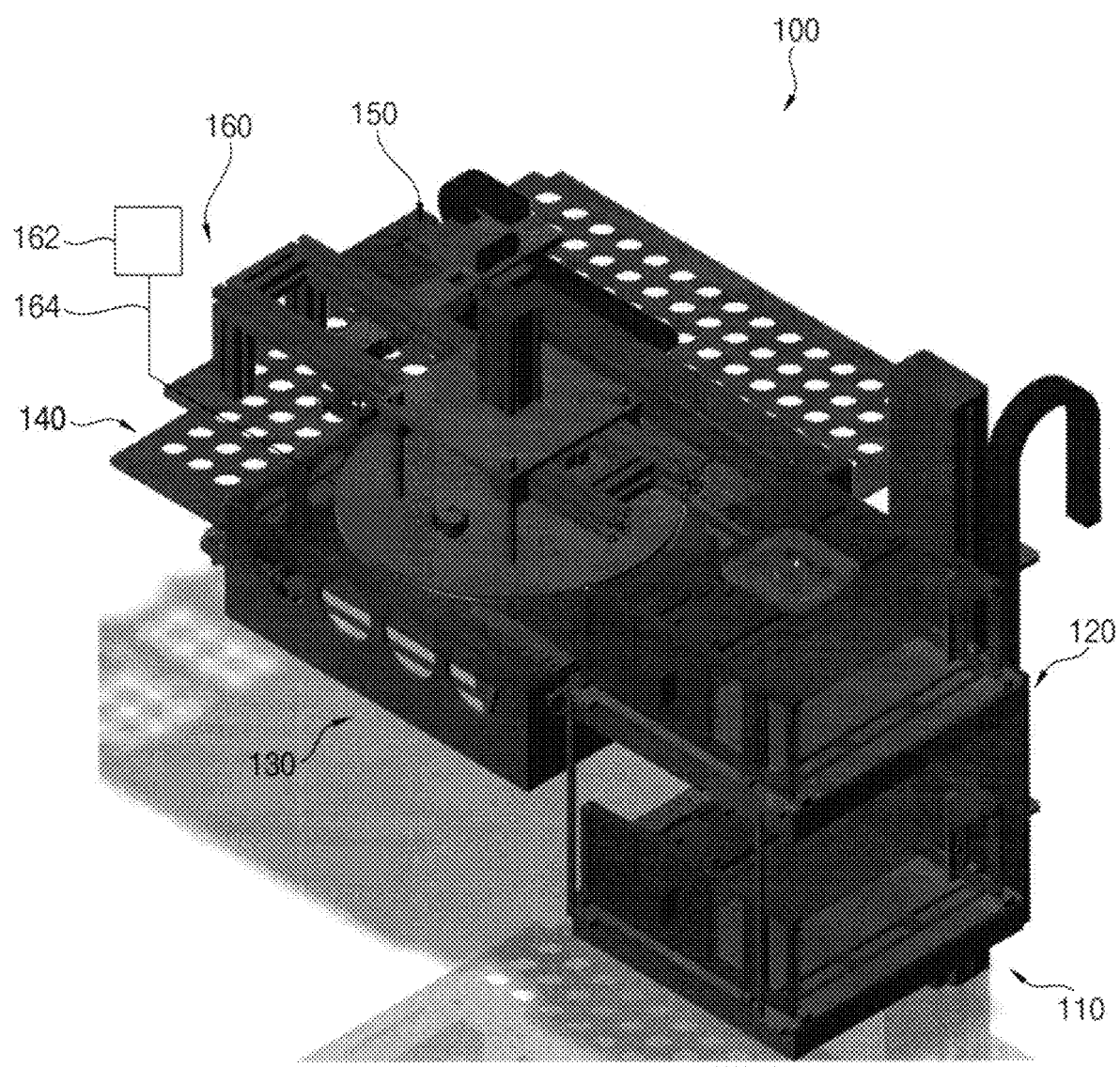
FIG. 1 is a perspective view illustrating a UV irradiation apparatus according to an exemplary embodiment of the present inventive concept.
Figure 2:
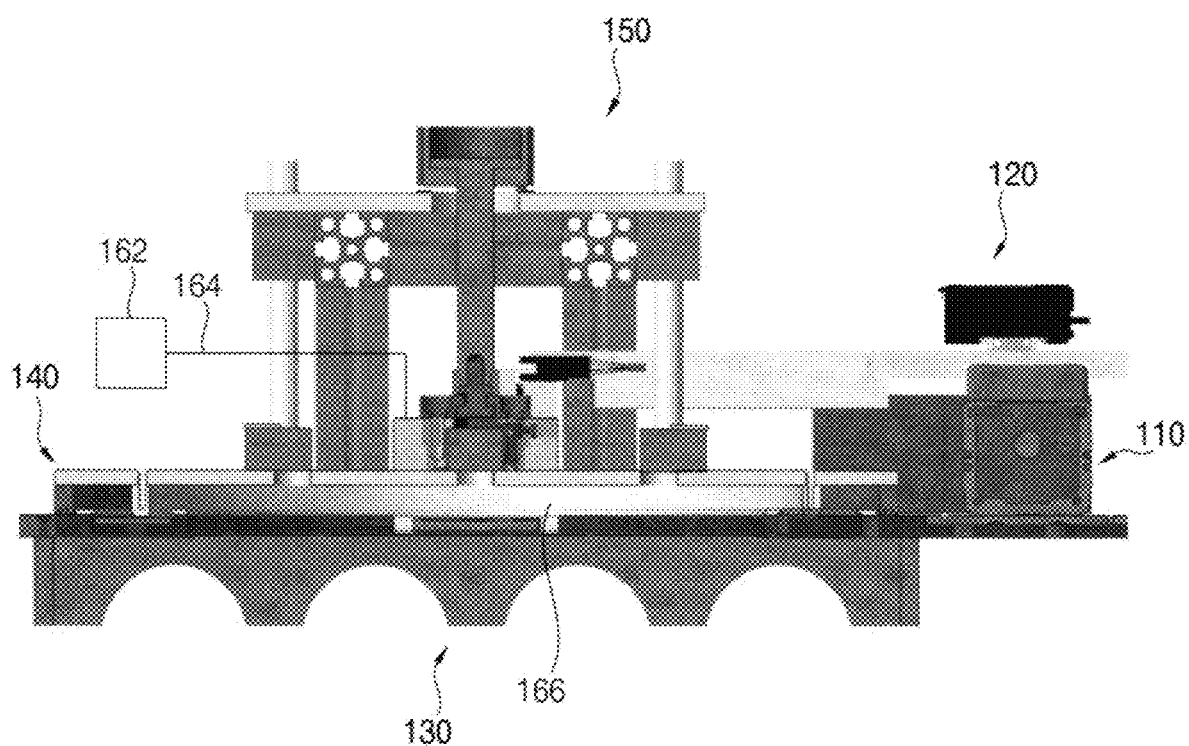
FIG. 2 is a cross-sectional view illustrating the UV irradiation apparatus in FIG. 1, according to an exemplary embodiment of the present inventive concept.
Figure 3:
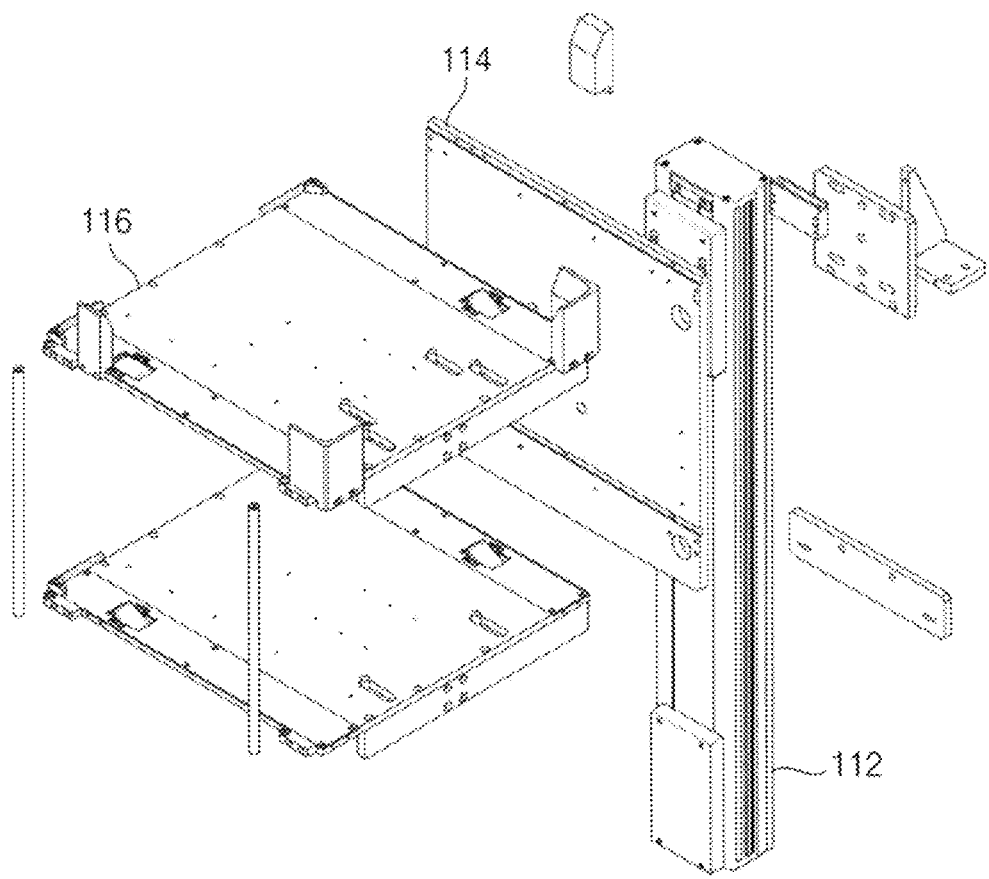
FIG. 3 is an exploded perspective view illustrating a loading module of the UV irradiation apparatus in FIG. 1, according to an exemplary embodiment of the present inventive concept.
Figure 4:
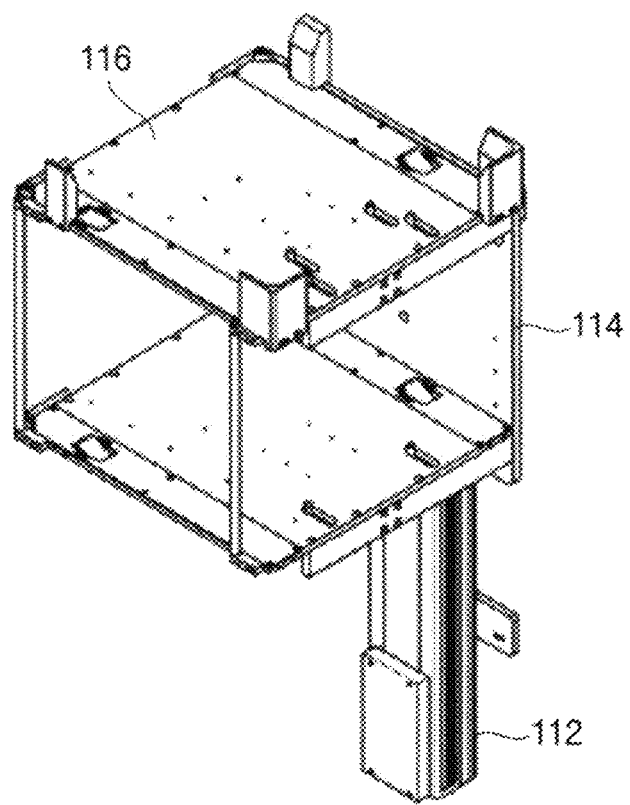
FIG. 4 is a perspective view illustrating the loading module in FIG. 3, according to an exemplary embodiment of the present inventive concept.
Figure 5:
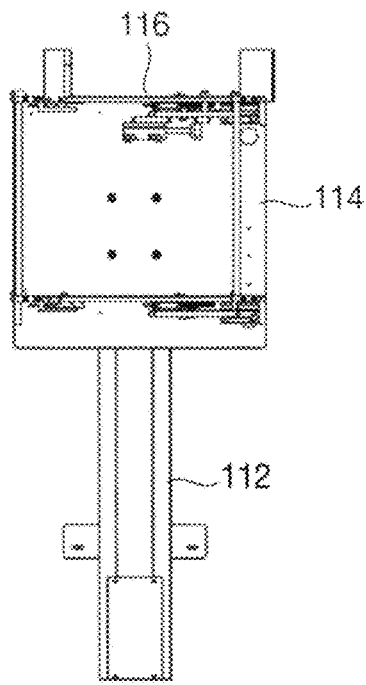
FIG. 5 is a front view illustrating the loading module in FIG. 4, according to an exemplary embodiment of the present inventive concept.
Figure 6:
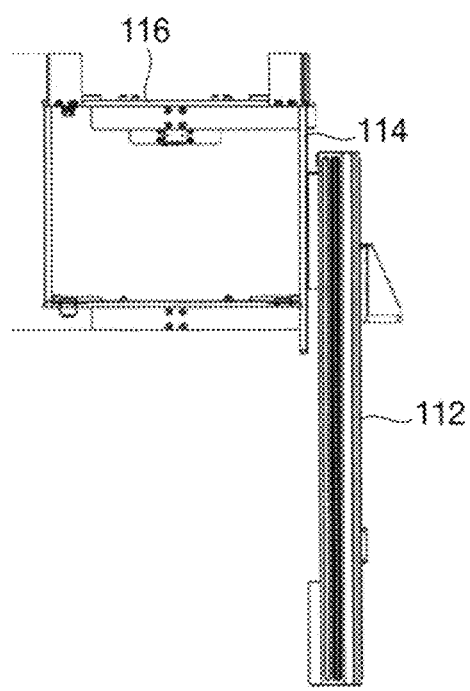
FIG. 6 is a side view illustrating the loading module in FIG. 4, according to an exemplary embodiment of the present inventive concept.
Figure 7:
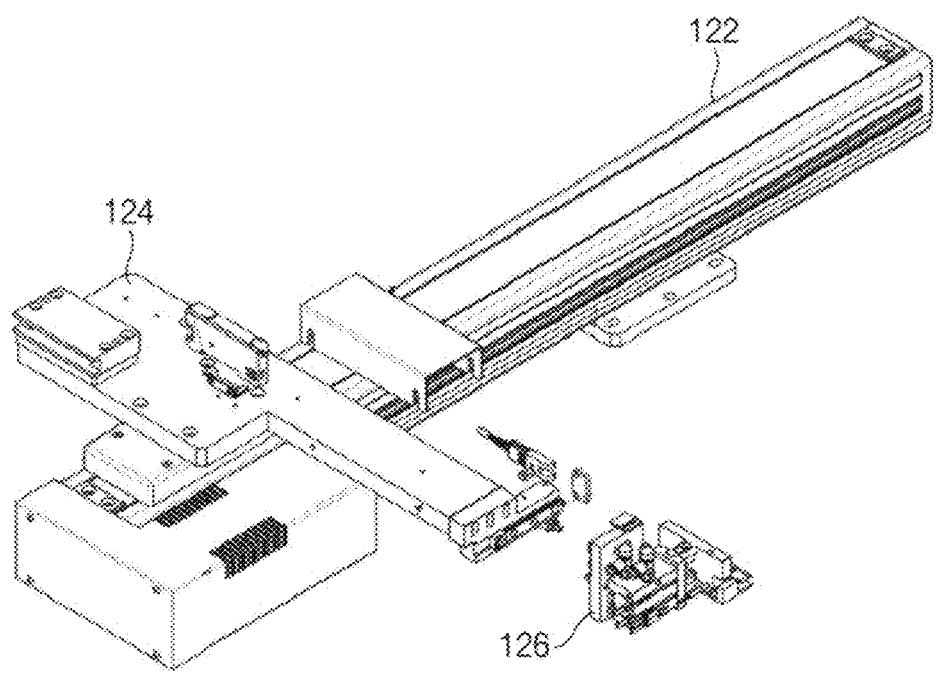
FIG. 7 is an exploded perspective view illustrating a transfer module of the UV irradiation apparatus in FIG. 1, according to an exemplary embodiment of the present inventive concept.
Figure 8:
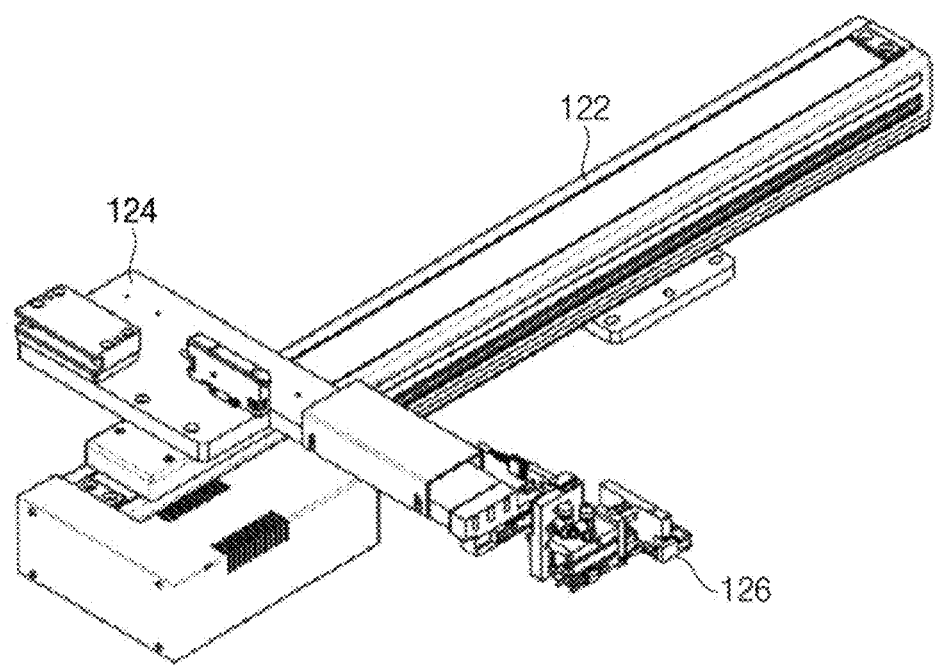
FIG. 8 is a perspective view illustrating the transfer module in FIG. 7, according to an exemplary embodiment of the present inventive concept.
Figure 9:
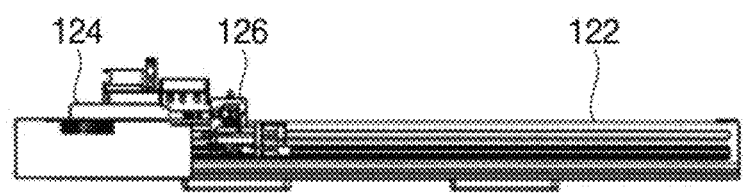
FIG. 9 is a front view illustrating the transfer module in FIG. 8, according to an exemplary embodiment of the present inventive concept.
Figure 10:
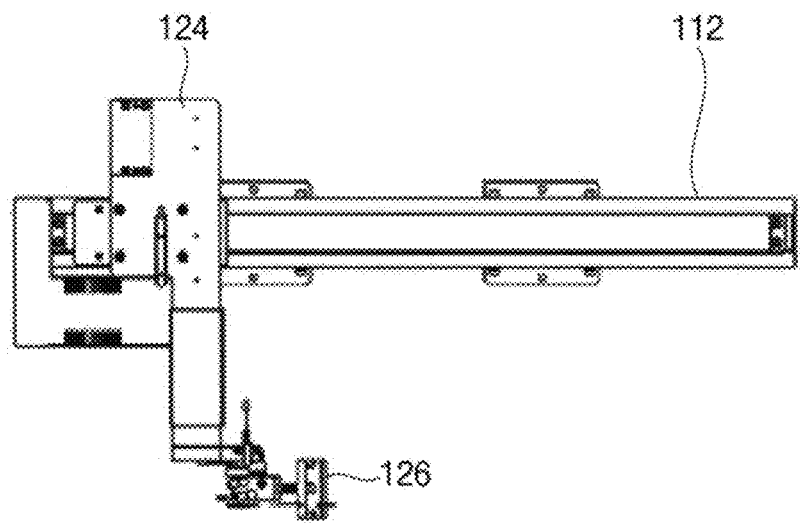
FIG. 10 is a plan view illustrating the transfer module in FIG. 8, according to an exemplary embodiment of the present inventive concept.
Figure 11:
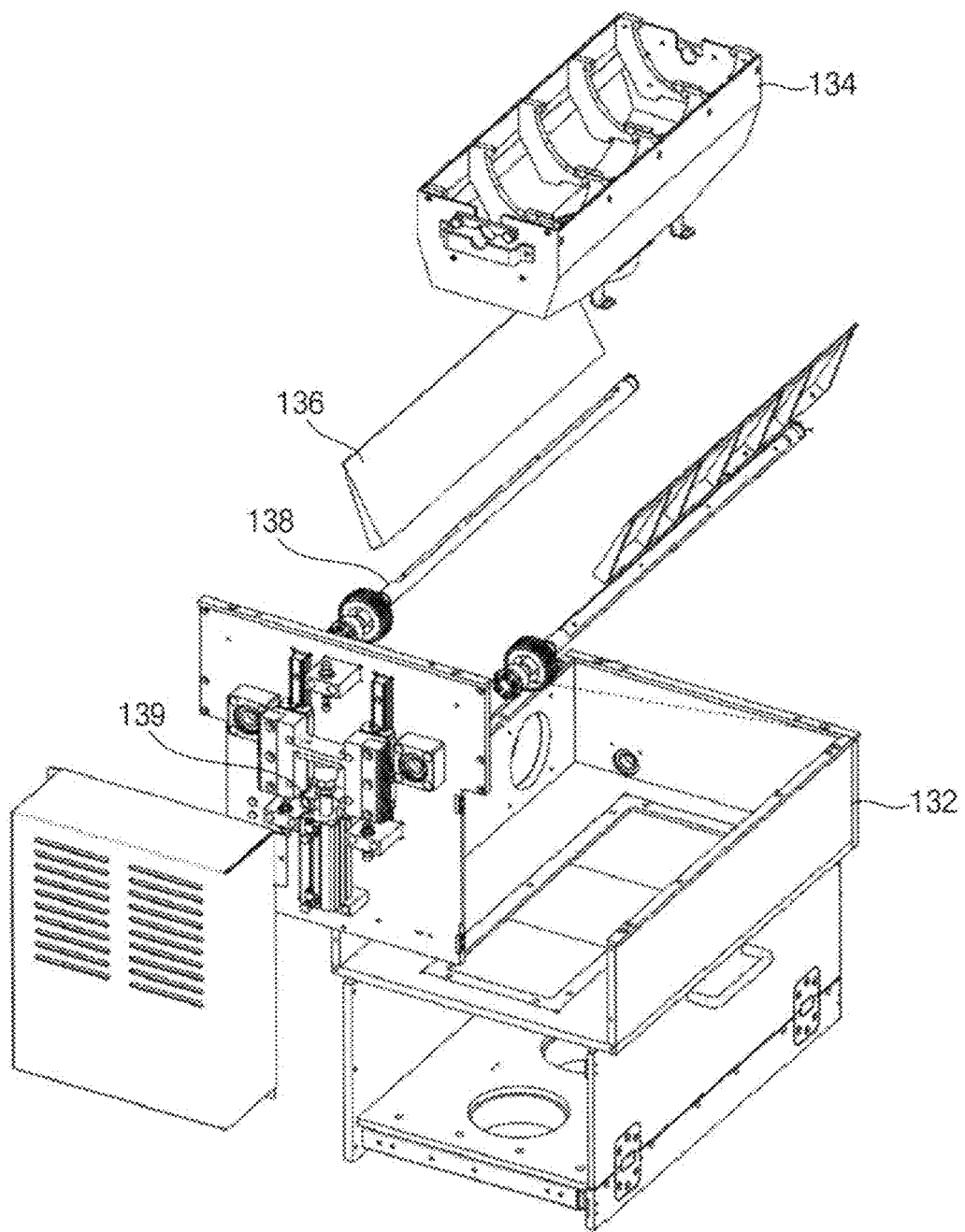
FIG. 11 is an exploded perspective view illustrating a UV irradiation module of the UV irradiation apparatus in FIG. 1, according to an exemplary embodiment of the present inventive concept.
Figure 12:
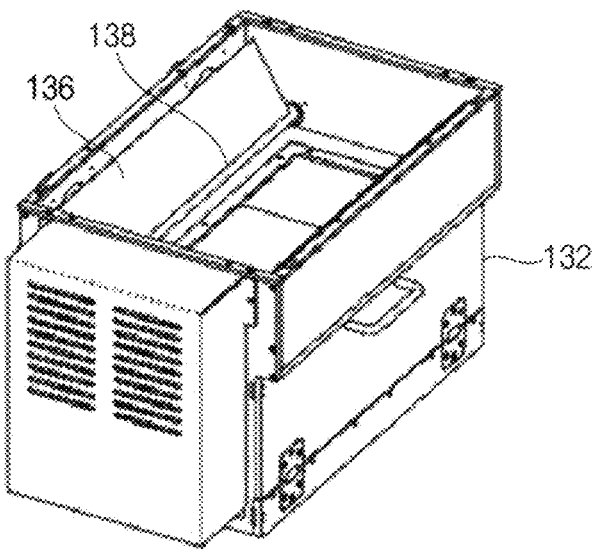
FIG. 12 is a perspective view illustrating the UV irradiation module in FIG. 11, according to an exemplary embodiment of the present inventive concept.
Figure 13:
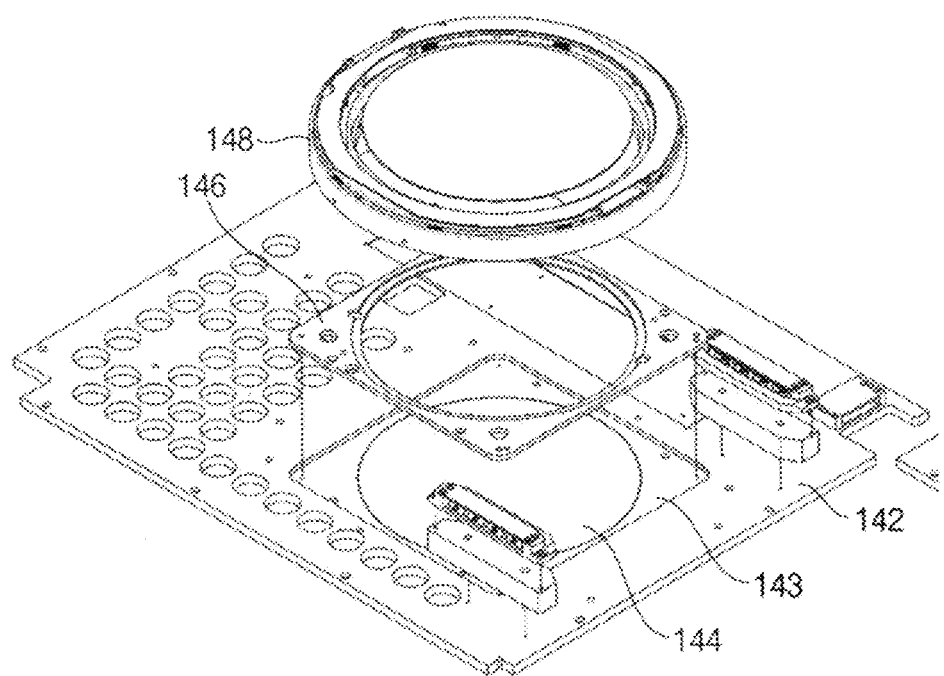
FIG. 13 is an exploded perspective view illustrating a base module of the UV irradiation apparatus in FIG. 1, according to an exemplary embodiment of the present inventive concept.
Figure 14:
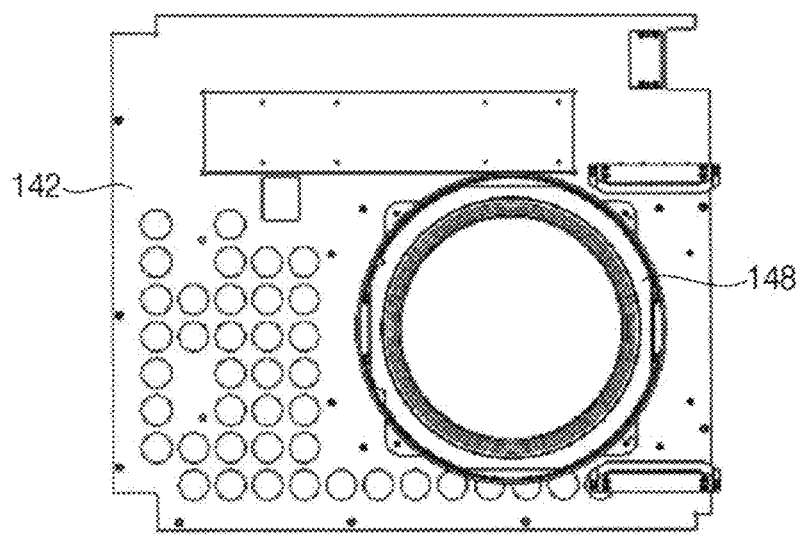
FIG. 14 is a plan view illustrating the base module in FIG. 13, according to an exemplary embodiment of the present inventive concept.
Figure 15:
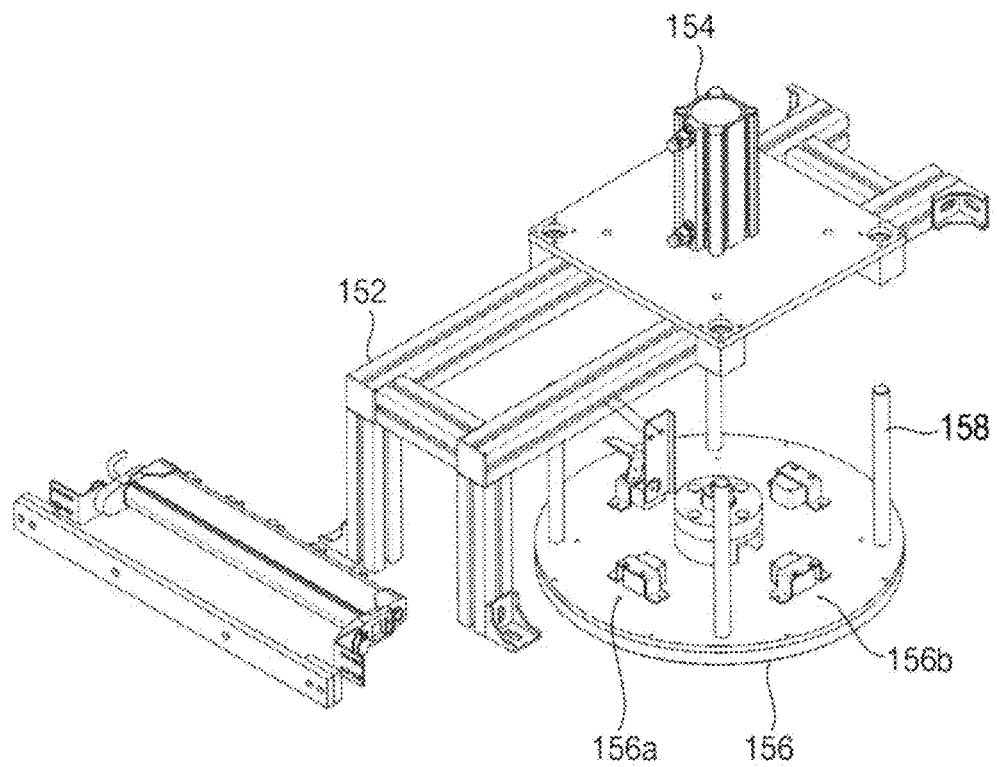
FIG. 15 is an exploded perspective view illustrating an expanding module of the UV irradiation apparatus in FIG. 1, according to an exemplary embodiment of the present inventive concept.
Figure 16:
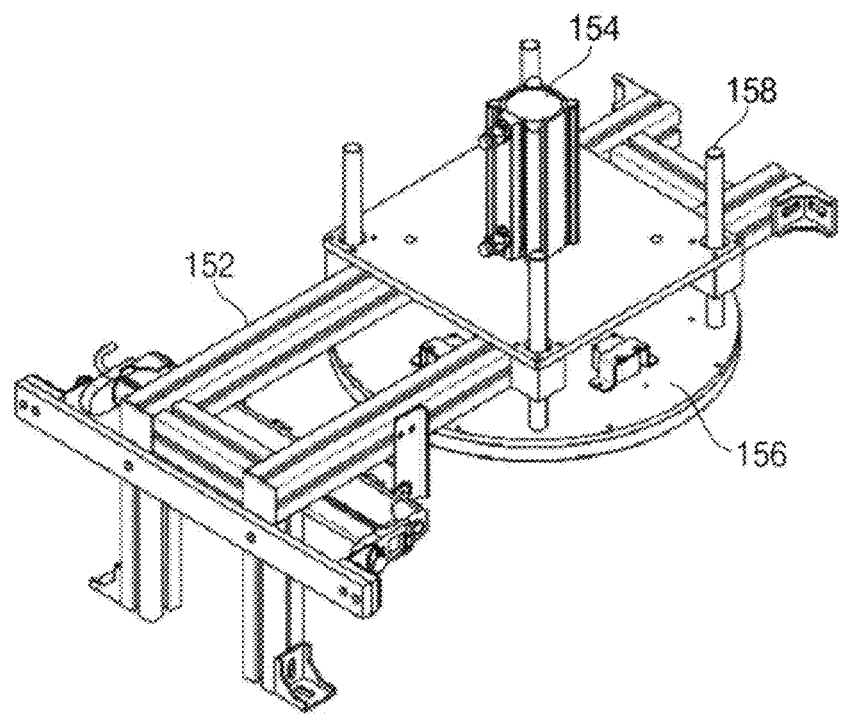
FIG. 16 is a perspective view illustrating the expanding module in FIG. 15, according to an exemplary embodiment of the present inventive concept.
Figure 17:
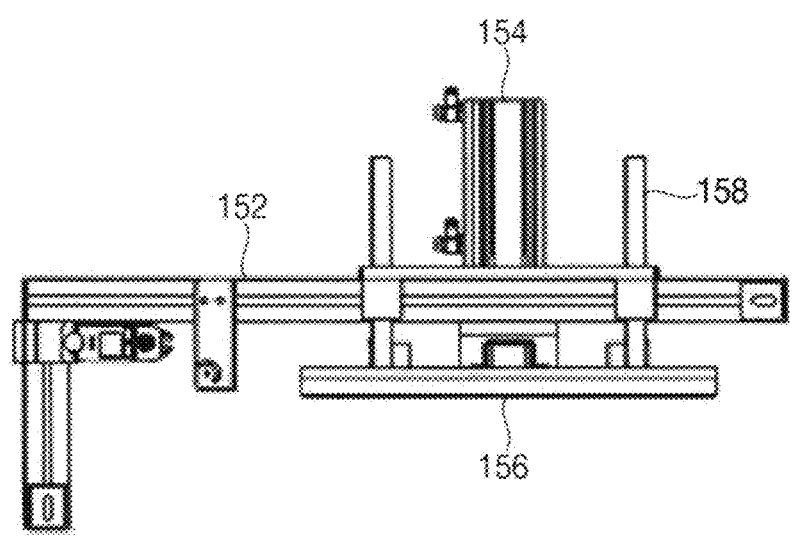
FIG. 17 is a side view illustrating the expanding module in FIG. 16, according to an exemplary embodiment of the present inventive concept.
Figure 18:
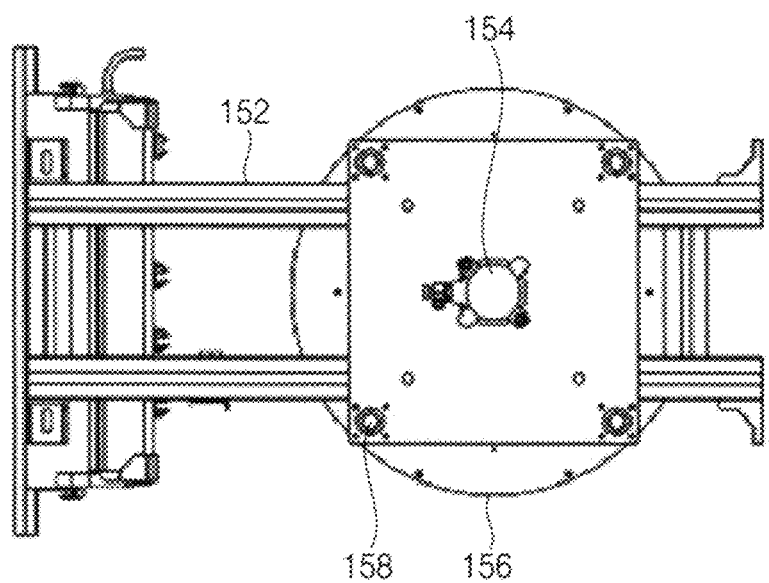
FIG. 18 is a plan view illustrating the expanding module in FIG. 16, according to an exemplary embodiment of the present inventive concept.

FIG. 1 is a perspective view illustrating a UV irradiation apparatus according to an exemplary embodiment of the present inventive concept. FIG. 2 is a cross-sectional view illustrating the UV irradiation apparatus in FIG. 1, according to an exemplary embodiment of the present inventive concept. FIG. 3 is an exploded perspective view illustrating a loading module of the UV irradiation apparatus in FIG. 1, according to an exemplary embodiment of the present inventive concept. FIG. 4 is a perspective view illustrating the loading module in FIG. 3, according to an exemplary embodiment of the present inventive concept. FIG. 5 is a front view illustrating the loading module in FIG. 4, according to an exemplary embodiment of the present inventive concept. FIG. 6 is a side view illustrating the loading module in FIG. 4, according to an exemplary embodiment of the present inventive concept. FIG. 7 is an exploded perspective view illustrating a transfer module of the UV irradiation apparatus in FIG. 1, according to an exemplary embodiment of the present inventive concept. FIG. 8 is a perspective view illustrating the transfer module in FIG. 7, according to an exemplary embodiment of the present inventive concept. FIG. 9 is a front view illustrating the transfer module in FIG. 8, according to an exemplary embodiment of the present inventive concept. FIG. 10 is a plan view illustrating the transfer module in FIG. 8, according to an exemplary embodiment of the present inventive concept. FIG. 11 is an exploded perspective view illustrating a UV irradiation module of the UV irradiation apparatus in FIG. 1, according to an exemplary embodiment of the present inventive concept. FIG. 12 is a perspective view illustrating the UV irradiation module in FIG. 11, according to an exemplary embodiment of the present inventive concept. FIG. 13 is an exploded perspective view illustrating a base module of the UV irradiation apparatus in FIG. 1, according to an exemplary embodiment of the present inventive concept. FIG. 14 is a plan view illustrating the base module in FIG. 13, according to an exemplary embodiment of the present inventive concept. FIG. 15 is an exploded perspective view illustrating an expanding module of the UV irradiation apparatus in FIG. 1, according to an exemplary embodiment of the present inventive concept. FIG. 16 is a perspective view illustrating the expanding module in FIG. 15, according to an exemplary embodiment of the present inventive concept. FIG. 17 is a side view illustrating the expanding module in FIG. 16, according to an exemplary embodiment of the present inventive concept, and FIG. 18 is a plan view illustrating the expanding module in FIG. 16, according to an exemplary embodiment of the present inventive concept.

Referring to FIGS. 1 and 2, a UV irradiation apparatus 100 of the present embodiment may include a loading module 110, a transfer module 120, a UV irradiation module 130, a base module 140, an expanding module 150 and a vacuum module 160.

The loading module 110 may be positioned at a side of the base module 140. The loading module 110 may load a cassette, which is configured to receive a plurality of wafers, into a loading position. A die attach film (DAF) may be attached to each of the wafers. A scribe lane of the wafer may be cut by a sawing process. A plurality of semiconductor chips formed in the wafer may be connected with each other via the DAF. The DAF may include a base film, a photo sensitive adhesive (PSA) and an adhesion layer sequentially stacked.

In an exemplary embodiment of the present inventive concept, the loading module 110 may include a tray and a motor and or actuator connected to the tray.

The transfer module 120 may be arranged between the loading module 110 and the base module 140. The transfer module 120 may load each of the wafers in the cassette into the base module 140 from the loading position. For example, the transfer module 120 may include a tray and a motor and/or actuator to move the wafers in the cassette.

The UV irradiation module 130 may be arranged under the base module 140. The UV irradiation module 130 may irradiate UV to the wafer loaded into the base module 140 to cure the DAF. For example, the UV irradiation nodule 130 may cure the PSA of the DAF to remove bondability of the PSA.

The expanding module 150 may be configured to move in a vertical direction over the base module 140. For example, the expanding module 150 may be configured to move down toward to an upper surface of the base module 140. For example, the expanding module 150 may include an actuator to move the expanding module 150 in a vertical direction. The expanding module 150 may be selectively combined with the base module 140. The expanding module 150 may expand the water in the base module 140 in a radial direction.

Any one of the semiconductor chips may have a warpage. The DAF attached to the warped semiconductor chip may have a gap. For example, when both edge portions of the semiconductor chip may be upwardly bent, the gap may be generated at portions of the DAF attached to the both edge portions of the semiconductor chip. For example, the gap may be formed between the PSA and the adhesion layer of the DAF. Thus, air, for example, oxygen may infiltrate into the gap between the PSA and the adhesion layer. The oxygen may reduce a bridging reaction of the UV on an exposed surface of the PSA so that the bondability of the PSA may not be completely removed. Therefore, the edge portions of the semiconductor chip may be adhered to the DAF so that the semiconductor chip may not be picked-up from the DAF.

To remove the bondability of the PSA, the vacuum module 160 may be configured to provide a vacuum to the wafer in the base module 140. The vacuum provided to the wafer may remove the air, for example, the oxygen infiltrating into the gap between the PSA and the adhesion layer. Although the gap may exist in the DAF due to the warpage of the semiconductor chip, the oxygen in the gap may be removed to maintain the bridging reaction property of the UV. As a result, the bondability of the PSA may be removed to readily pick-up the semiconductor chip from the DAF.

In an exemplary embodiment of the present inventive concept, the vacuum module 160 may include a vacuum pump 162, a vacuum line 164 and a vacuum chamber 166. The vacuum chamber 166 may be formed by combining the base module 140 with the expanding module 150. For example, the vacuum chamber 166 may be formed by combining the descended expanding module 150 with the base module 140. The vacuum pump 162 may provide the vacuum chamber 166 with the vacuum through the vacuum line 164. The vacuum line 164 may transfer the vacuum to the vacuum chamber 166 through the expanding module 150.

Referring to FIGS. 3 to 6, the loading module 110 may include an actuator 112, a lifting plate 114 and a loading plate 116.

The lifting plate 114 may extend in a first direction (e.g., a vertical direction) and may be configured to move in a vertical direction. The lifting plate 114 may be connected to the actuator 112. The actuator 112 may be configured to move the lifting plate 114 in the vertical direction. For example, the lifting plate 114 may extend in the same direction as the actuator 112.

The loading plate 116 may extend in a second direction (e.g., a horizontal direction) crossing the first direction. For example, the loading plate 116 may be substantially perpendicular to the lifting plate 114. The loading plate 116 may be connected to the lifting plate 114. The cassette may be placed on an upper surface of the loading plate 116. Thus, the loading plate 116 may be lifted by the actuator 112 to load the cassette into the loading position.

Referring to FIGS. 7 to 10, the transfer module 120 may include an actuator 122, a transfer block 124 and a gripper 126.

The actuator 122 may be configured to generate a linear force along the horizontal direction. The transfer block 124 may be connected to the actuator 122. Thus, the transfer block 124 may be moved in the horizontal direction by the actuator 122.

The gripper 126 may be installed at an end of the transfer block 124. The gripper 126 may grip the wafer in the cassette located at the loading position by the loading module 110. When the gripper 126 is moved from the loading position to the base module 140 by the actuator 122, the wafer gripped by the gripper 126 may be transferred to the base module 140.

Referring to FIGS. 11 and 12, the UV irradiation module 130 may include a housing 132, a lamp holder 134 and a shutter 136.

The lamp holder 134 may be configured to hold a UV lamp. The lamp holder 134 may have an opened upper surface. The UV lamp in the lamp holder 134 may irradiate the UV in the upward direction, e.g., toward the base module 140. The housing 132 may be configured to receive the lamp holder 134.

The shutter 136 may be configured to open close the opened upper surface of the lamp holder 134. The shutter 136 may include a pair of shutters. The pair of the shutters 136 may be connected to horizontally arranged rotation shafts 138. An actuator 139 may rotate the rotation shafts 138 with respect to a horizontal axis. Thus, the shutters 136 may be rotated in a clockwise or a counterclockwise direction in accordance with rotation directions of the rotation shafts 138 to open or close the opened upper surface of the lamp holder 134.

Referring to FIGS. 13 and 14, the base module 140 may include a base 142 a glass 144, a supporting plate 146 and a wafer holder 148.

The base 142 may have a polygonal shape, for example, a rectangular shape or a square shape. The base 142 may have a window 143 through which the UV may pass. The window 143 may have a circular shape. The window 143 may be positioned over the lamp holder 134.

The glass 144 may be installed at the window 143. The UV emitted from the UV lamp may pass through the glass 144. Because the window 143 may have the circular shape, the glass 144 may have a circular shape.

The wafer holder 148 may be arranged over the glass 144 via the supporting plate 146. The wafer may be placed on the wafer holder 148. The wafer holder 148 may have an annular shape configured to support an edge portion of a lower surface of the wafer. Because the lower surface of the wafer may be exposed through a central portion of the annular wafer holder 148, the UV emitted from the UV lamp may be irradiated to the lower surface of the wafer, e.g., the DAF through the glass 144.

Referring to FIGS. 15 to 18, the expanding module 150 may include a frame 152, an actuator 154, an expanding press 156 and a guide rod 158.

The actuator 154 may be installed at the frame 152. The actuator 154 may be configured to generate a linear force along the vertical direction.

The expanding press 156 may be lifted by the actuator 154. The lifting movement of the expanding press 156 may be supported by the guide rod 158. The expanding press 156 downwardly moved by the actuator 154 may press the wafer on the wafer holder 148 to expand the wafer in a radial direction. For example, the expanding press 156 may have a circular plate shape. The expanding press 156 may have a diameter substantially the same as that of the wafer holder 148.

The expanding press 156 downwardly moved by the actuator 154 may be combined with the wafer holder 148 to form the vacuum chamber 166. For example, the vacuum chamber 166 may be formed by the expanding press 156, the wafer holder 148 and the glass 144.

The expanding press 156 may have at least one vacuum hole 156a connected to the vacuum line 164. The vacuum hole 156a may be vertically formed in the expanding press 156. For example, the vacuum hole 156a may penetrate the expanding press 156. Thus, the vacuum generated from the vacuum pump 162 may be transmitted to the vacuum chamber 166 through the vacuum line 164 and the vacuum hole 156a.

Further, the expanding press 156 may have at least one purge hole 156b. The purge hole 156b may be vertically formed in the expanding press 156. A purge gas may be introduced into the water through the purge hole 156*b*. The purge gas may function to remove particles in the vacuum chamber 166.

Figure 19:
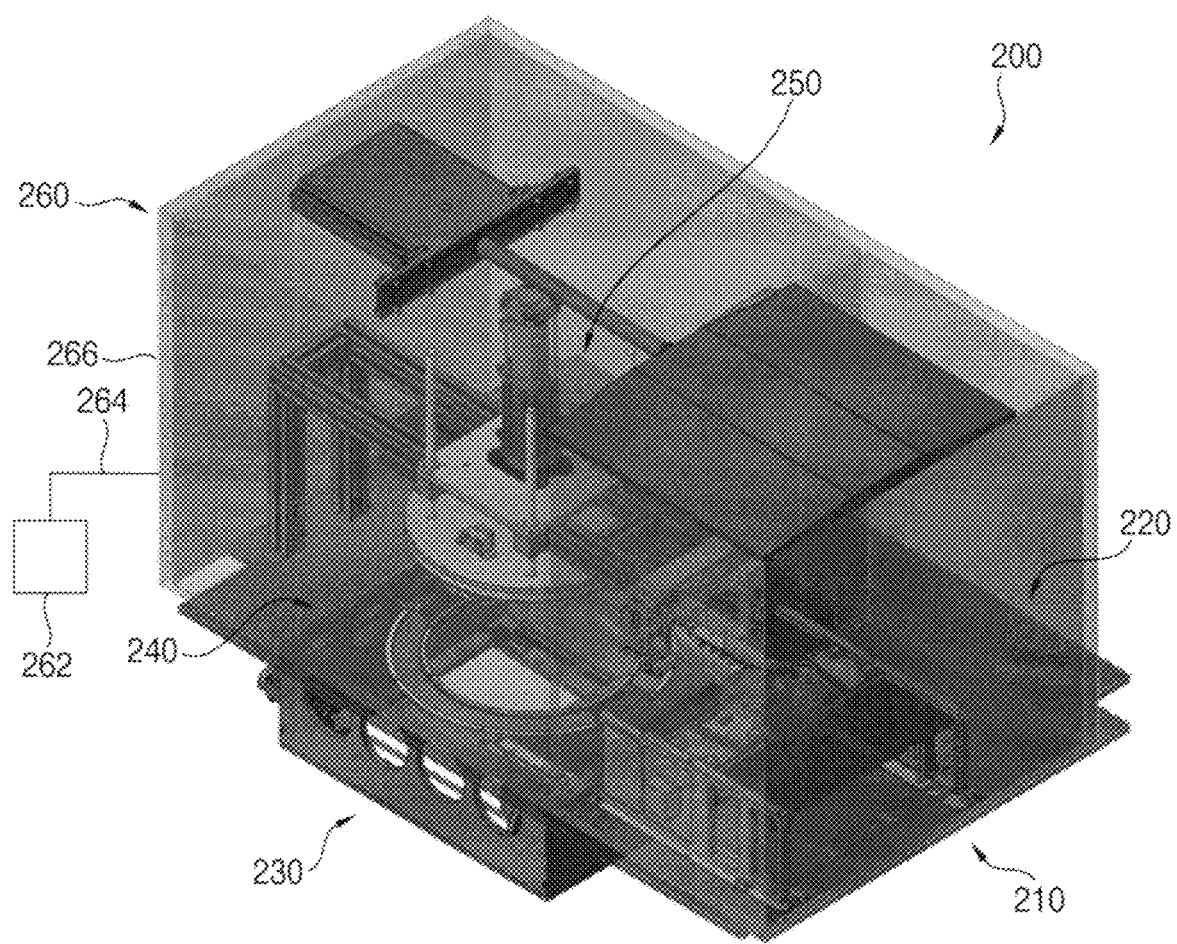
FIG. 19 is a perspective view illustrating a UV irradiation apparatus according to an exemplary embodiment of the present inventive concept.
Figure 20:
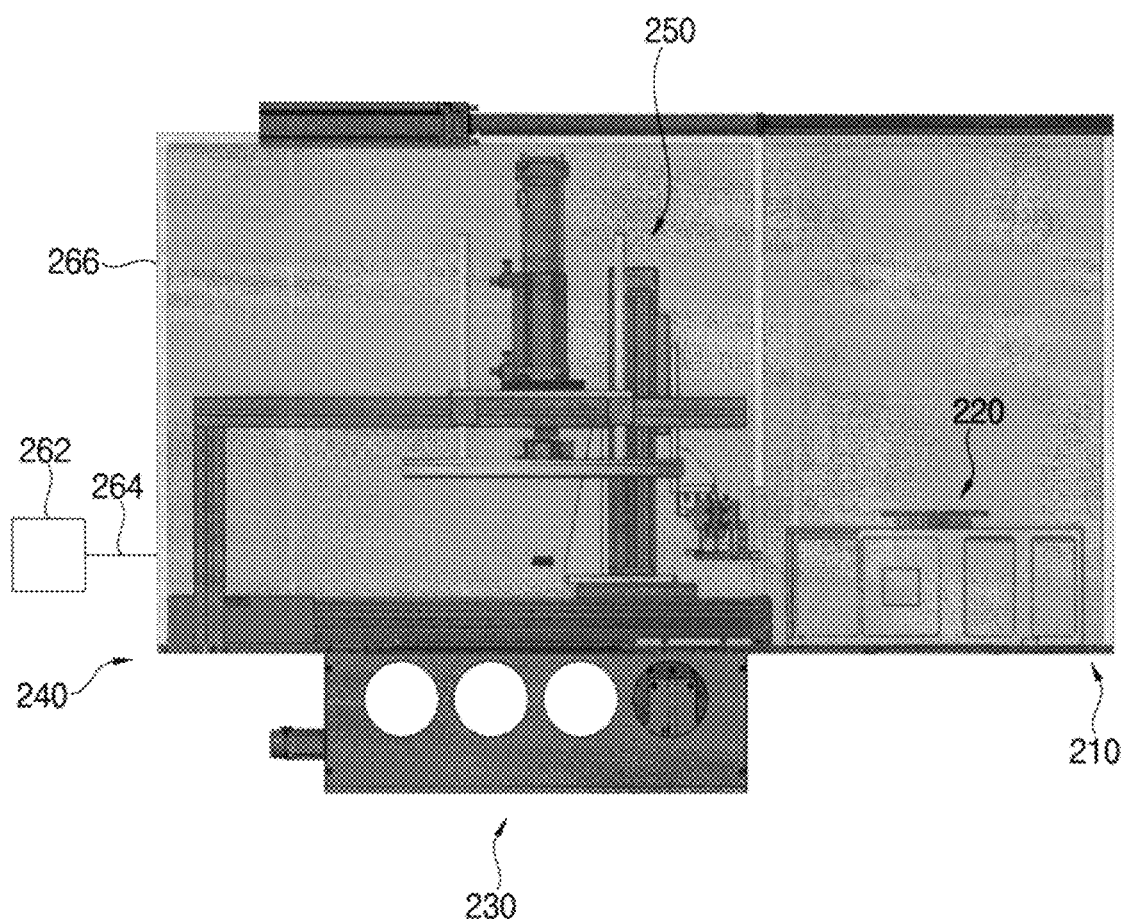
FIG. 20 is a cross-sectional view illustrating the UV irradiation apparatus in FIG. 19, according to an exemplary embodiment of the present inventive concept.

FIG. 19 is a perspective view illustrating a UV irradiation apparatus according to an exemplary embodiment of the present inventive concept, and FIG. 20 is a cross-sectional view illustrating the UV irradiation apparatus in FIG. 19, according to an exemplary embodiment of the present inventive concept.

Referring to FIGS. 19 and 20, a UV irradiation apparatus 200 according to an exemplary embodiment of the present inventive concept may include a loading module 210, a transfer module 220, a UV irradiation module 230, a base module 240, an expanding module 250, and a vacuum module 260.

The loading module 210, the transfer module 220, the UV irradiation module 230, the base module 240 and the expanding module 250 of the UV irradiation apparatus 200 may be substantially the same as the loading module 110, the transfer module 120, the UV irradiation module 130, the base module 140 and the expanding module 150 in FIG. 1. Thus, any further illustrations with respect to the loading module 210, the transfer module 220, the UV irradiation module 230, the base module 240 and the expanding module 250 of the UV irradiation apparatus 200 may be omitted herein for brevity.

The vacuum module 260 may include a vacuum pump 262, a vacuum line 264 and a vacuum chamber 266. The vacuum chamber 256 may be configured to receive at least the base module 240 and the expanding module 250. In an exemplary embodiment of the present inventive concept, the vacuum chamber 266 may be configured to receive the loading module 210, the transfer module 220, the base module 240 and the expanding module 250.

Therefore, the vacuum supplied to the vacuum chamber 266 from the vacuum pump 262 may be applied to the loading module 210, the transfer module 220, the base module 240 and the expanding module 250. The vacuum provided in the present embodiment may have functions substantially the same as those of the vacuum illustrated with reference to FIG. 1. Thus, any further illustrations with respect to the functions of the vacuum may be omitted herein for brevity.

Method of Manufacturing a Semiconductor Package

Figure 21:
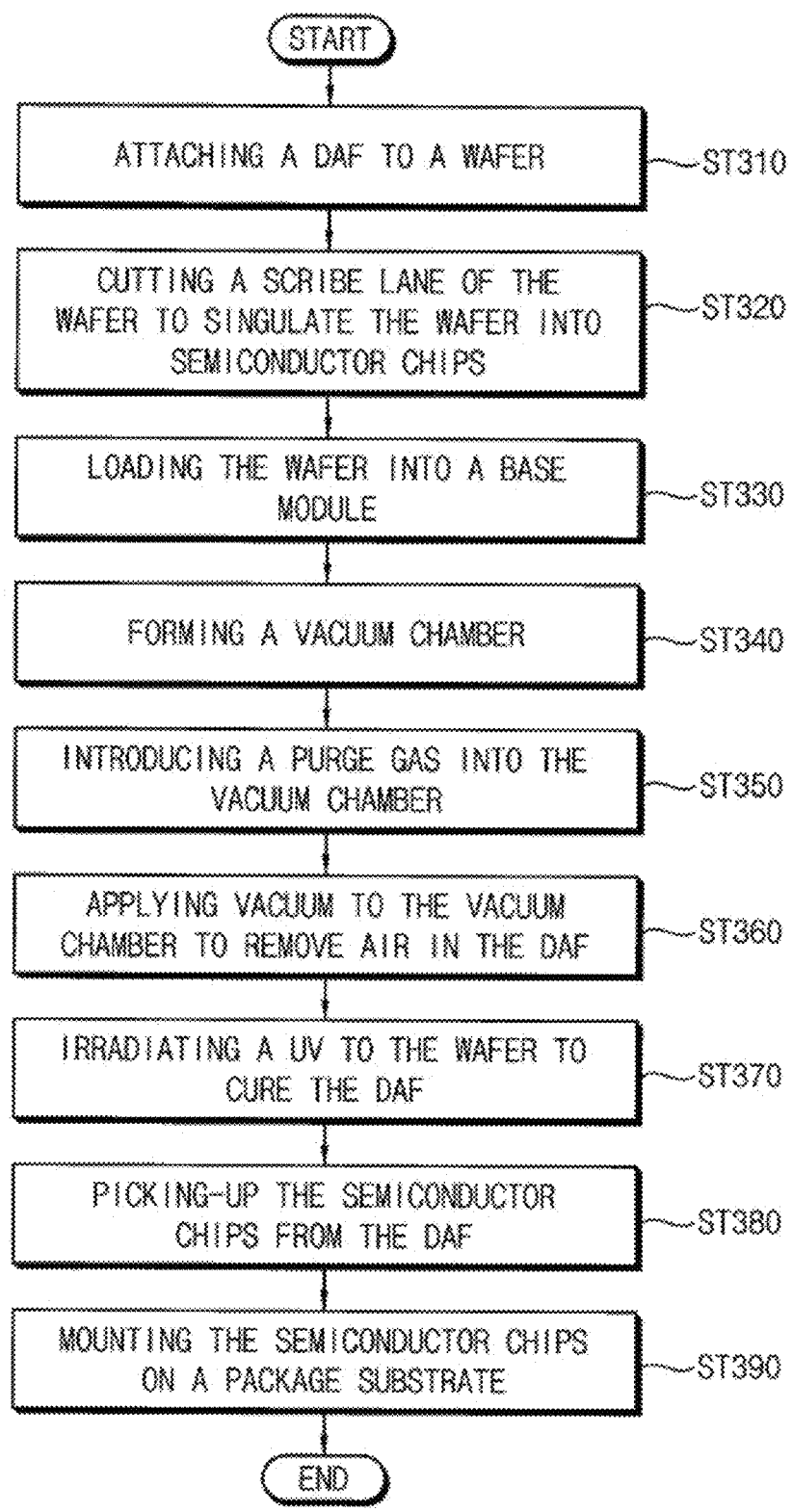
FIG. 21 is a flow chart illustrating a method of manufacturing a semiconductor package using the apparatus in FIG. 1, according to an exemplary embodiment of the present inventive concept.

FIG. 21 is a flow chart illustrating a method of manufacturing a semiconductor package using the apparatus in FIG. 1, according to an exemplary embodiment of the present inventive concept.

Referring to FIGS. 1 and 21, in step ST310, the DAF may be attached to the wafer.

In step ST320, the scribe lane of the wafer may be cut to singulate the wafer into the semiconductor chips. For example, the wafer may be cut using a blade or a laser. The semiconductor chips may be connected with each other via the DAF.

In step ST330, the wafer may be loaded into the base module 140. For example, the cassette, in which the wafers may be received, may be placed on the loading plate 116 of the loading module 110. The actuator 112 of the loading module 110 may ascend or descend the loading plate 116 to position the cassette at the loading position.

The gripper 126 of the transfer module 120 may grip the wafer in the cassette. The actuator 122 of the transfer module 120 may move the gripper 126 to the base module 140 to load the wafer into the base module 140. The wafer may then be placed on the wafer holder 148 of the base module 140.

In step ST340, the expanding module 150 may be downwardly moved. The expanding module 150 may then be combined with the base module 140 to form the vacuum chamber 166.

For example, the actuator 154 of the expanding module 150 may descend the expanding press 156. The descended expanding press 156 may be combined with the wafer holder 148 to form the vacuum chamber 166 provided by the expanding press 156, the wafer holder 148 and the glass 144.

In step ST350, the purge gas may be introduced into the vacuum chamber 166 through the purge hole 156*b* to remove the particles front the vacuum chamber 166.

In step ST360, the vacuum module 160 may supply the vacuum to the wafer in the vacuum chamber 166 to remove the air, for example, the oxygen in the DAF.

For example, the vacuum generated from the vacuum pump 162 may be introduced into the vacuum chamber 166 through the vacuum line 164 and the vacuum hole 156*a*. The vacuum may discharge the air, for example, the oxygen between the PSA and the adhesion layer of the DAF from the vacuum chamber 166.

In step ST370, the UV irradiation module 130 may irradiate the UV to the wafer in the vacuum chamber 166 to cure the DAF.

For example, the actuator 139 of the UV irradiation module 130 may rotate the rotation shafts 138 to open the shutter 136. Thus, the opened upper surface of the lamp holder 134 may also be opened.

The UV emitted from the UV lamp may be irradiated to the wafer in the vacuum chamber 166 through the glass 144. The UV may cure the DAF to remove the bondability of the PSA. As mentioned above, because the air, for example, the oxygen between the PSA and the adhesion layer of the DAF may be removed by the vacuum, the bridging reaction of the UV on the exposed surface of the PSA may be maintained to remove the bondability of the PSA.

In step ST380, the semiconductor chips may be picked-up from the DAF. As mentioned above, because the bondability of the PSA may be removed, the semiconductor chips may not be adhered to the DAF. Thus, the semiconductor chips may be readily picked-up from the DAF.

In step ST390, the semiconductor chips may be mounted on an upper surface of the package substrate. For example, the semiconductor chips may be electrically connected with the package substrate using a conductive bump or a conductive wire. Further, a molding member may be formed on the upper surface of the package substrate to cover the semiconductor chips. In addition, external terminals may then be mounted on a lower surface of the package substrate.

In an exemplary embodiment of the present inventive concept, the semiconductor package may be manufactured using the apparatus in FIG. 1. In addition, the semiconductor package may be manufactured using the apparatus in FIG. 19.

According to an exemplary embodiment of the present inventive concept, the vacuum may be provided to the wafer to remove the air, for example, oxygen in the DAF caused by a warpage of the semiconductor chip. Thus, a bridging reaction of the UV on an exposed surface of a photo sensitive adhesion (PSA) of the DAF may be maintained to remove bondability of the PSA. As a result, the semiconductor chips may be readily picked-up from the DAF.

Exemplary embodiments of the present inventive concept provide an ultraviolet (UV) irradiation apparatus that may be capable of removing bondability of a die attach film (DAF).

Exemplary embodiments of the present inventive concept may provide a method of manufacturing a semiconductor package using the above-mentioned UV irradiation apparatus.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:

1. An ultraviolet (UV) irradiation apparatus comprising:
a base module configured to support a wafer including a plurality of semiconductor chips, wherein the plurality of semiconductor chips are connected with each other via a die attach film (DAF);
a vacuum module configured to provide the wafer with a vacuum and to remove air from the DAF;
a UV irradiation module configured to irradiate UV to the wafer in the vacuum module; and
an expanding module configured to expand the wafer in the vacuum module, wherein the expanding module includes an expanding press arranged over the base module and configured to move in a vertical direction to combine with the base module, wherein a vacuum hole penetrates a surface of the expanding press.

2. The UV irradiation apparatus of claim 1, whereinwherdn the vacuum module comprises:
a vacuum chamber configured to receive the wafer; and
a vacuum pump configured to provide the vacuum chamber with the vacuum.

3. The UV irradiation apparatus of claim 2, wherein the vacuum chamber includes the expanding module with the base module.

4. The UV irradiation apparatus of claim 3, wherein the vacuum chamber is connected with the vacuum pump through the vacuum hole in the expanding module.

5. The UV irradiation apparatus of claim 2, wherein the vacuum chamber is configured to receive the base module and the expanding module.

6. The UV irradiation apparatus of claim 1, wherein the base module comprises:
a base having a window configured to pass the UV irradiated from the UV irradiation module therethrough; and
a wafer holder installed at the window to hold the wafer, wherein the wafer holder is configured to combine with the expanding module.

7. The UV irradiation apparatus of claim 1, wherein the UV irradiation module comprises:
a UV lamp arranged under the base module;
a lamp holder configured to hold the UV lamp; and
a shutter configured to open and close an upper surface of the lamp holder.

8. The UV irradiation apparatus of claim 1, wherein the expanding module comprises:
actuator configured to move the expanding press in the vertical direction.

9. The UV irradiation apparatus of claim 8, wherein the expanding press has a purge hole configured to introduce a purge gas into the wafer.

10. The UV irradiation apparatus of claim 1, further comprising:
a loading module configured to load a cassette into a loading position, wherein the cassette is configured to receive the wafers; and
a transfer module configured to transfer the received wafers in the cassette to the base module.

11. The UV irradiation apparatus of claim 10, wherein the loading module comprises:
a loading plate configured to support the cassette; and
an actuator configured to move the loading plate.

12. The UV irradiation apparatus of claim 10, wherein the transfer module comprises:
a gripper configured to grip the wafer; and
an actuator configured to transfer the gripper from the loading module to the base module.

13. An ultraviolet (UV) irradiation apparatus comprising:
a UV irradiation module configured to irradiate UV to a wafer to cure a die attach film (DAF), wherein the wafer includes a plurality of semiconductor chips connected with each other via the DAF;
a base having a window configured to pass the UV radiated from the UV irradiation module therethrough;
a wafer holder installed at the window and configured to hold the wafer;
an expanding press arranged over the base and configured to move in a vertical direction to expand the wafer and combine with the wafer holder to form a vacuum chamber configured to receive the wafer, wherein a vacuum hole penetrates a surface of the expanding press;
a vacuum pump configured to provide the vacuum chamber with vacuum;
a loading module configured to load a cassette into a loading position, wherein the cassette is configured to receive the wafers; and
a transfer module configured to transfer the received wafer in the cassette to the wafer holder.

14. The UV irradiation apparatus of claim 13, wherein the vacuum hole is configured to introduce the vacuum into the vacuum chamber.

15. The UV irradiation apparatus of claim 14, wherein the expanding press has a purge hole configured to introduce a purge gas into the vacuum chamber.

16. The UV irradiation apparatus of claim 13, wherein the UV irradiation module comprises:
a UV lamp arranged under the base;
a lamp holder configured to hold the UV lamp; and.
a shutter configured to open and close an upper surface of the lamp holder.

17. The UV irradiation apparatus of claim 13, wherein the loading module comprises:
a loading plate configured to support the cassette; and
an actuator configured to move the loading plate.

18. The UV irradiation apparatus of claim 13, Wherein the transfer module comprises:
a gripper configured to grip the wafer; and
an actuator configured to transfer the gripper from the loading module to the base.

19. A method of manufacturing a semiconductor package, the method comprising:
attaching a die attach film (DAF) to a wafer;
cutting a scribe lane of the wafer to singulate the wafer into a plurality of semiconductor chips;
introducing a purge gas into the wafer;
providing the wafer with vacuum to remove air from the DAF after introducing the purge gas into the wafer;
irradiating an ultraviolet (UV) to the wafer to cure the DAF;

picking-up the semiconductor chips from the DAF; and
mounting the semiconductor chips on a package substrate.

\* \* \* \* \*